United States Patent
Kang et al.

(10) Patent No.: US 9,225,316 B2
(45) Date of Patent: *Dec. 29, 2015

(54) DUTY CYCLE CORRECTION CIRCUIT AND OPERATION METHOD THEREOF

(71) Applicant: SK hynix Inc., Gyeonggi-do (KR)

(72) Inventors: Shin-Deok Kang, Gyeonggi-do (KR); Jae-Min Jang, Gyeonggi-do (KR); Yong-Ju Kim, Gyeonggi-do (KR); Hae-Rang Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/668,488

(22) Filed: Mar. 25, 2015

(65) Prior Publication Data

US 2015/0200655 A1   Jul. 16, 2015

Related U.S. Application Data

(62) Division of application No. 13/844,928, filed on Mar. 16, 2013, now Pat. No. 9,018,994.

(30) Foreign Application Priority Data

Dec. 28, 2012 (KR) .......... 10-2012-0157319
Dec. 28, 2012 (KR) .......... 10-2012-0157327

(51) Int. Cl.
*H03K 3/017* (2006.01)
*H03K 5/156* (2006.01)

(52) U.S. Cl.
CPC .......... *H03K 3/017* (2013.01); *H03K 5/1565* (2013.01)

(58) Field of Classification Search
CPC .......... H03K 3/017
USPC .......... 327/175
See application file for complete search history.

(56) References Cited

U.S. PATENT DOCUMENTS

| | | | |
|---|---|---|---|
| 7,015,739 B2* | 3/2006 | Lee et al. | 327/175 |
| 7,501,870 B2* | 3/2009 | Choi et al. | 327/175 |
| 7,675,337 B2* | 3/2010 | Koo | 327/175 |
| 8,207,771 B2* | 6/2012 | Koo | 327/175 |
| 8,207,772 B2* | 6/2012 | Shin | 327/175 |
| 8,513,996 B2* | 8/2013 | Kim et al. | 327/175 |
| 9,018,994 B2 | 4/2015 | Kang et al. | |
| 2008/0024182 A1* | 1/2008 | Choi et al. | 327/175 |
| 2008/0191767 A1* | 8/2008 | Koo | 327/175 |
| 2011/0227623 A1* | 9/2011 | Koo | 327/175 |
| 2011/0291725 A1* | 12/2011 | Shin | 327/175 |
| 2012/0194244 A1* | 8/2012 | Kim et al. | 327/175 |

OTHER PUBLICATIONS

Office Action issued by the USPTO for another continuation U.S. Appl. No. 14/668,542 of the parent U.S. Appl. No. 13/844,928 on Jun. 17, 2015.

* cited by examiner

Primary Examiner — Ryan Jager
(74) Attorney, Agent, or Firm — IP & T Group LLP

(57) ABSTRACT

A duty cycle correction circuit includes a clock adjustment unit configured to adjust a duty ratio of an input clock signal in response to a duty control signal and generate an output clock signal, a tracking type setting unit configured to generate an tracking type selection signal for setting a first or second tracking type based on a duty locking state of the output clock signal, and a control signal generation unit configured to generate the duty control signal, into which the first or second tracking type is incorporated, in response to the tracking type selection signal and the output clock signal.

5 Claims, 4 Drawing Sheets

DUTY CYCLE CORRECTION CIRCUIT AND OPERATION METHOD THEREOF

CROSS-REFERENCE TO RELATED APPLICATIONS

This application is a division of U.S. patent application Ser. No. 13/844,928 filed on Mar. 16, 2013, which claims priority of Korean Patent Application Nos. 10-2012-0157327 and 10-2012-0157319, filed on Dec. 28, 2012. The disclosures of each of the foregoing application are incorporated herein by reference in their entireties.

BACKGROUND

1. Field

Exemplary embodiments of the present invention relate to semiconductor design technology, and more particularly, to a duty cycle correction circuit and operation method thereof.

2. Description of the Related Art

In general, semiconductor devices, such as double data rate synchronous DRAM (DDR SDRAM), perform a desired operation in response to different kinds of signals received from an external controller. Such semiconductor devices are developing toward a high-speed operation according to users' demands. For the high-speed operation of the semiconductor devices, a clock signal having a high frequency should be provided from the outside. The external clock signal is the source of an internal clock signal that is internally used in a semiconductor device, and the frequencies of the external clock signal and/or the internal clock signal determine the operating frequencies of the semiconductor device. Basically, if the frequency of the clock signal is high, the operating speed of the semiconductor device may be increased. An increase in the frequency of the clock signal, however, is limited. A variety of methods have been proposed to overcome the limit. One of the methods is a double data rate (DDR) method for enhancing the utilization of the clock signal.

The existing single data rate (SDR) method is, for example, a method of inputting/outputting data in response to the rising edge of a clock signal, whereas the DDR method is a method of inputting/outputting data in response to both of the rising edge and the falling edge of a clock signal. That is, two data is input/output in one cycle of the clock signal. Accordingly, more data may be processed in the DDR method than in the SDR method for the same period.

Meanwhile, to process data in response to both of the rising edge and the falling edge of a clock signal as in the DDR method, it may be important to maintain the duty ratio of a clock signal at 50:50. That is, the logic 'High' section of a clock signal must be identical with the logic 'Low' section of the clock signal. When the 50:50 duty ratio of a clock signal is broken due to a jitter component and other reasons, reliability of data input/output in response to the clock signal may not be guaranteed.

Furthermore, an increase in the frequency of a clock signal may cause difficulties in controlling the duty ratio of the clock signal. Accordingly, schemes for precisely and quickly controlling the duty ratio of a clock signal having a high frequency are in demand.

SUMMARY

Exemplary embodiments of the present invention are directed to provide a duty cycle correction circuit for correcting the duty ratio of a clock signal rapidly and precisely, and an operating method of the duty cycle correction circuit.

In accordance with an embodiment of the present invention, a duty cycle correction circuit may include a clock adjustment unit configured to adjust a duty ratio of an input clock signal in response to a duty control signal and generate an output clock signal, a tracking type setting unit configured to generate an tracking type selection signal for setting a first or second tracking type based on a duty locking state of the output clock signal, and a control signal generation unit configured to generate the duty control signal into which the first or second tracking type is incorporated, in response to the tracking type selection signal and the output clock signal.

Preferably, the first tracking type may be a successive approximation register (SAR) tracking type, and the second tracking type may be a linear tracking type.

In accordance with another embodiment of the present invention, an operating method of the duty cycle correction circuit may include detecting a duty ratio of an dock signal, assigning first and second bits into which first and second tracking types are incorporated among a plurality of bits forming a duty control signal based on the duty ratio of the clock signal, setting respective bits of the first bits, and setting respective bits of the second bits. The duty ratio of the clock signal is adjusted in response to the duty control signal when a bit of the first or second bits is set.

In accordance with yet another embodiment of the present invention, an operating method of the duty cycle correction circuit may include determining whether an initial locking is completed, performing a first locking operation for correcting a duty ratio of a clock signal at a first target duty ratio in response to a duty control signal generated by using a first tracking type based on a result of the determining step, performing a second locking operation for correcting the duty ratio of the clock signal at a second target duty ratio in response to the duty control signal generated by using a second tracking type based on the result of the determining step, and selecting one of the first locking operation and the second locking operation corresponding to the result of the determining step.

The duty cycle correction circuit in accordance with the embodiments of the present invention generates a duty control signal in a different tracking type depending on a duty ratio of a clock signal and corrects the duty ratio of the clock signal by using the generated duty control signal. Accordingly, a dock signal having a desired duty ratio may be generated more precisely and rapidly.

DETAILED DESCRIPTION

Figure 1:
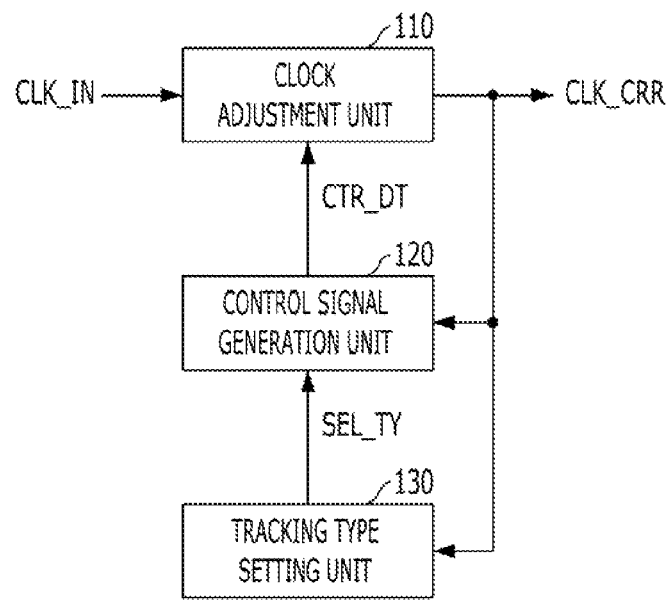
FIG. 1 is a block diagram illustrating a duty cycle correction circuit in accordance with an embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art.

Throughout the disclosure, reference numerals correspond directly to the like numbered parts in the various figures and embodiments of the present invention.

In this specification, 'connected/coupled' represents that one component is directly coupled to another component or indirectly coupled through another component. In addition, a singular form may include a plural form as long as it is not specifically mentioned in a sentence.

FIG. 1 is a block diagram illustrating a duty cycle correction circuit in accordance with an embodiment of the present invention.

Referring to FIG. 1, the duty cycle correction circuit includes a clock adjustment unit 110, a control signal generation unit 120, and a tracking type setting unit 130.

The clock adjustment unit 110 adjusts the duty ratio of an input clock signal CLK_IN in response to a duty control signal CTR_DT and generates an output clock signal CL_CRR having the adjusted duty ratio. In order for the output clock signal CLK_CRR to have a desired duty ratio (hereinafter, referred to as a 'target duty ratio'), a specific time is taken. If control based on the duty control signal CTR_DT is not incorporated, the duty ratio of the output clock signal CLK_CRR may be substantially the same as that of the input clock signal CLK_IN.

The control signal generation unit 120 generates the duty control signal CTR_T by incorporating a tracking type corresponding to a tracking type selection signal SEL_TY into the duty control signal CTR_DT, Tracking types that are incorporated into the duty control signal CTR_DT may include a successive approximation register (SAR) tracking type and a linear tracking type. Furthermore, the duty control signal CTR_DT that is finally generated may become a digital signal or an analog signal.

The tracking type setting unit 130 generates the tracking type selection signal SEL_TY corresponding to a duty ratio of the output clock signal CLK_CRR. The control signal generation unit 120 may generate the duty control signal CTR_DT in the SAR tracking type or the duty control signal CTR_DT in the linear tracking type in response to the tracking type selection signal SEL_TY.

The duty cycle correction circuit in accordance with the embodiment of the present invention may generate the duty control signal CTR_DT in the SAR tracking type or the linear tracking type based on a duty ratio of the output clock signal CLK_CRR.

Figure 2:
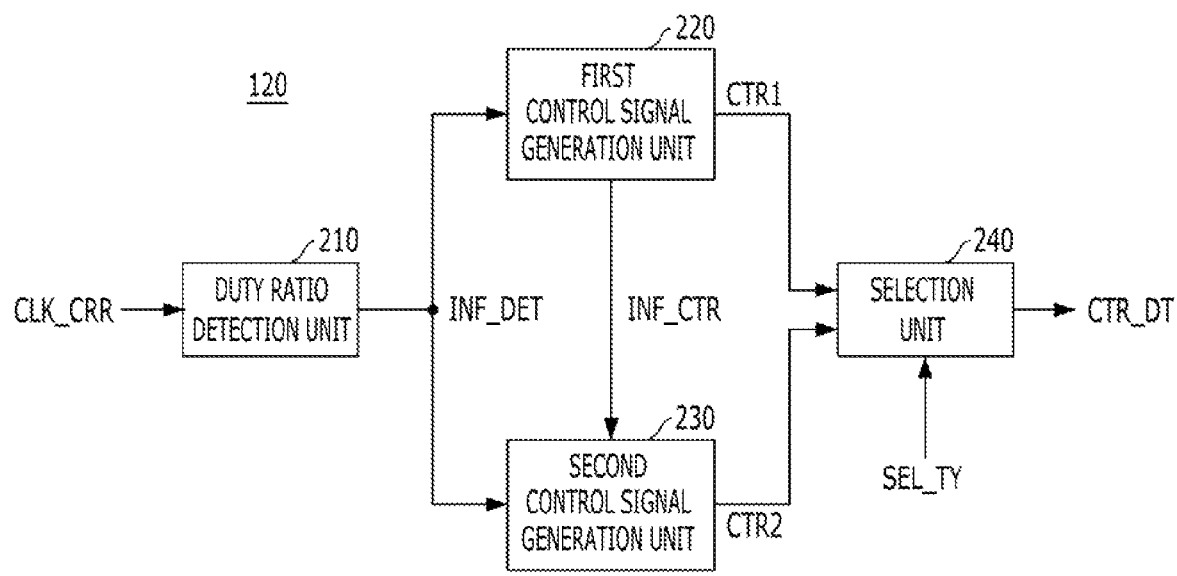
FIG. 2 is a detailed diagram illustrating an embodiment of a control signal generation unit shown in FIG. 1.

FIG. 2 is a detailed diagram illustrating an embodiment of the control signal generation unit 120 shown in FIG. 1.

Referring to FIG. 2, the control signal generation unit 120 includes a duty ratio detection unit 210, a first control signal generation unit 220, a second control signal generation unit 230, and a selection unit 240.

The duty ratio detection unit 210 detects a duty ratio of the output clock signal CLK_CRR and provides the first and the second control signal generation units 220 and 230 with detection information INF_DET corresponding to the detected duty ratio. The detection information INF_DET may include information on a duty ratio and locking information. The locking information indicates whether the output clock signal CLK_CRR is corrected at a target duty ratio.

The first control signal generation unit 220 generates a first duty control signal CTR1 by incorporating the SAR tracking type into the first duty control signal CTR1 based on the detection information INF_DET.

The second control signal generation unit 230 generates a second duty control signal CTR2 by incorporating the linear tracking type into the second duty control signal CTR2 based on the detection information INF_DET.

The selection unit 240 selectively outputs the first duty control signal CTR1 or the second duty control signal CTR2 as the duty control signal CTR_DT in response to the tracking type selection signal SEL_TY.

Here, the second control signal generation unit 230 may set an initial value of the second duty control signal CTR2 by using state value information INF_CTR corresponding to the state value of the first duty control signal CTR1.

An operation of the duty cycle correction circuit in accordance with the embodiment of the present invention is described in brief with reference to FIGS. 1 and 2.

Basically, the dock correction unit 110 generates the output dock signal CLK_CRR in response to the duty control signal CTR_DT. At the initial stage, the input clock signal CLK_IN becomes the output clock signal CLK_CRR without change because information for adjusting the input dock signal CLK_IN is not incorporated into the duty control signal CTR_DT.

Meanwhile, the tracking type setting unit 130 generates the tracking type selection signal SEL_TY based on a duty ratio of the output clock signal CLK_CRR. For example, if the duty ratio of the output clock signal CLK_CRR is relatively great or abnormally changed, the tracking type setting unit 130 may control a tracking type of the control signal generation unit 120 by using the tracking type selection signal SEL_TY.

Next, the control signal generation unit 120 selectively outputs the first duty control signal CTR1 generated from the first control signal generation unit 220 or the second duty control signal CTR2 generated from the second control signal generation unit 230, in response to the tracking type selection signal SEL_TY, as the duty control signal CTR_DT. For example, the control signal generation unit 120 outputs the first duty control signal CTR1 into which the SAR tracking type is incorporated as the duty control signal CTR_DT or outputs the second duty control signal CTR2 into which the linear tracking type has been incorporated as the duty control signal CTR_DT. The clock adjustment unit 110 adjusts a duty ratio of the input dock signal CLK_IN in response to the duty control signal CTR_DT output as described above and generates the output dock signal CLK_CRR with the corrected duty ratio.

The duty cycle correction circuit in accordance with the embodiment of the present invention may generate the duty control signal CTR_DT into which the SAR tracking type or the linear tracking type is incorporated according to a duty ratio of the output clock signal CLK_CRR, correct the duty ratio of the input clock signal CLK_IN in response to the duty control signal CTR_DT, and control the duty ratio of the output clock signal CLK_CRR so that it has a target duty ratio.

Figure 3:
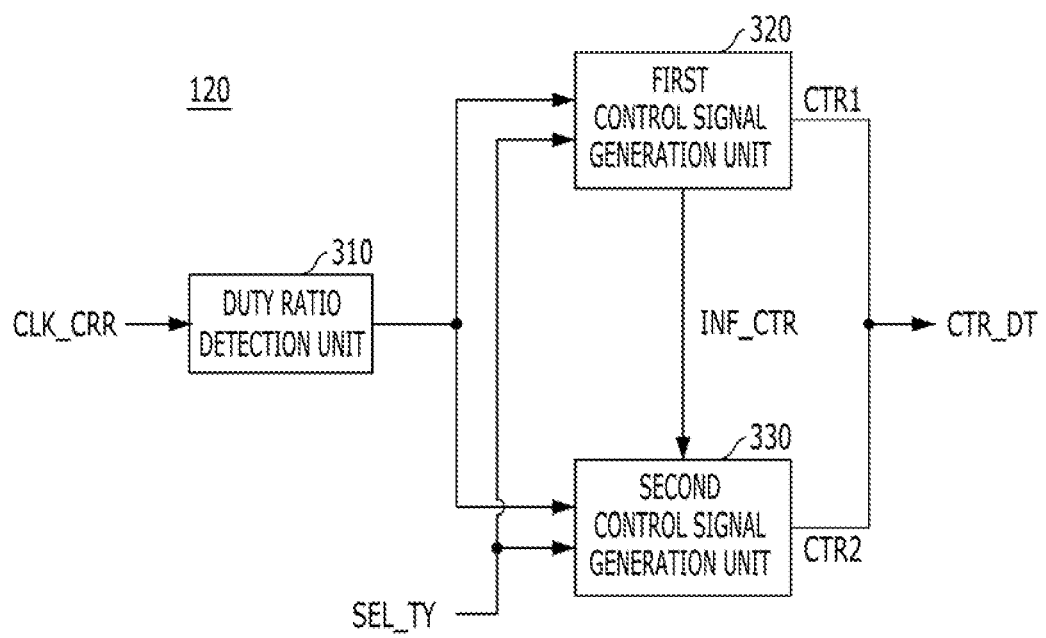
FIG. 3 is a detailed diagram illustrating another embodiment of the control signal generation unit shown in FIG. 1.

FIG. 3 is a detailed diagram illustrating another embodiment of the control signal generation unit 120 shown in FIG. 1.

Referring to FIG. 3, the control signal generation unit 120 includes a duty ratio detection unit 310 and first and second control signal generation units 320 and 330.

In the embodiment of FIG. 3, the selection unit 240 of FIG. 2 is removed and the selective enable operations of the first and the second control signal generation units 320 and 330 are controlled in response to the tracking type selection signal SEL_TY used to control the selection unit 240 as compared with the embodiment of FIG. 2. More particularly, the first and the second control signal generation units 320 and 330 are selectively enabled in response to the tracking type selection signal SEL_TY. In particular, the enable periods of the first control signal generation unit 320 and the second control signal generation unit 330 are independently controlled. That is, the second control signal generation unit 330 is disabled when the first control signal generation unit 320 is enabled, and the first control signal generation unit 320 is disabled when the second control signal generation unit 330 is enabled.

For reference, the elements according to the embodiment of FIG. 3 and the elements according to the embodiments of FIG. 2 corresponding to the respective elements of FIG. 3 perform the same operations, and the duty control signals CTR_DT that are finally generated also are the same. In the embodiment of FIG. 3, the unnecessary power consumption may be reduced because the first and the second control signal generation units 320 and 330 operate only in necessary periods. That is, power consumption necessary for a duty correction operation may be minimized.

Figure 4:
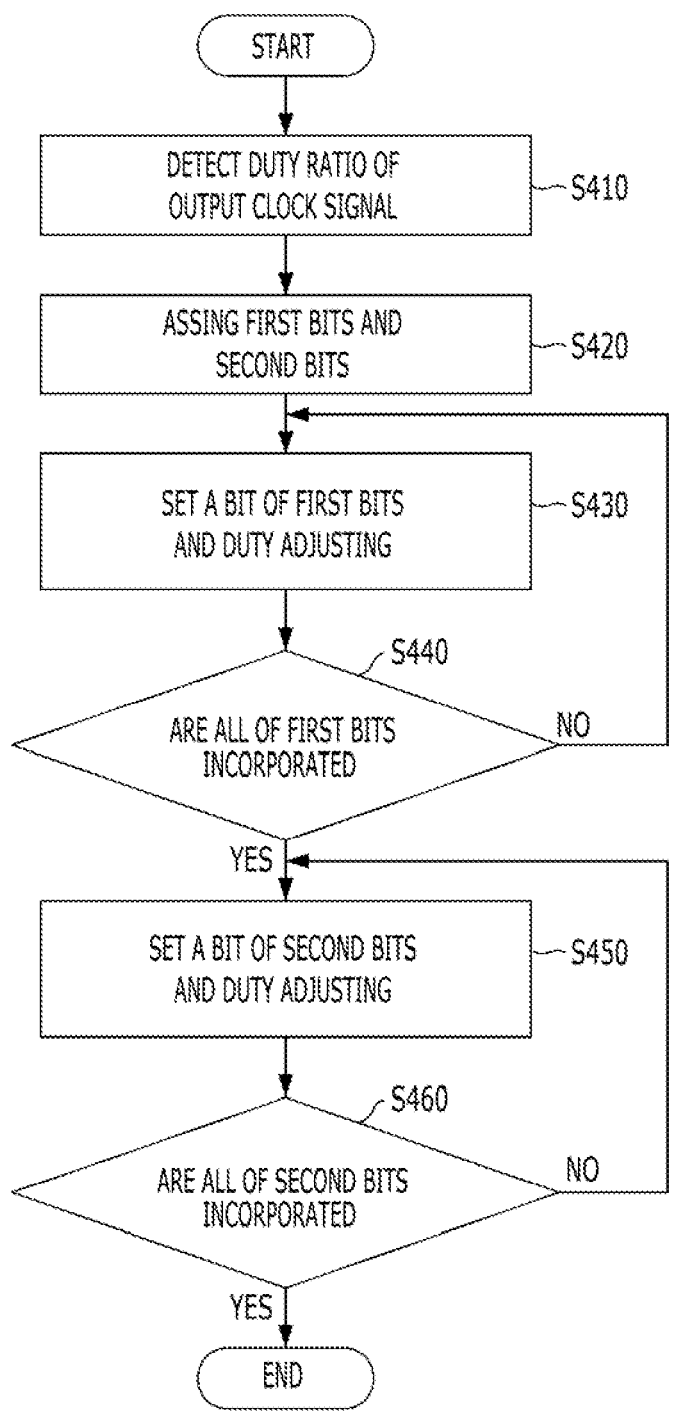
FIG. 4 is a flowchart illustrating operating method of the duty cycle correction circuit in accordance with another embodiment of the present invention.

FIG. 4 is a flowchart illustrating an operating method of the duty cycle correction circuit in accordance with another embodiment of the present invention. A relation between the duty control signal CTR_DT and the first and the second tracking types is described below. Furthermore, an example in which the duty control signal CTR_DT includes a plurality of bits is described.

Referring to FIGS. 1 and 4, at the step S410 the duty ratio of the output clock signal CTR_CRR is detected. At the step S420, first and second bits into which the first and the second tracking types are to be incorporated, among a plurality of bits forming the duty control signal CTR_DT, are assigned based on a result of the detection at the step S410, that is, a result of whether the difference between the detected duty ratio and a target duty ratio is greater or smaller than a given value. For example, if the duty control signal CTR_DT includes 5 bits, MSB 2 bits of the duty control signal CTR_DT may be assigned as the first bits and the remaining 3 bits of the duty control signal CTR_DT may be assigned as the second bits based on the result of the detection at the step S410.

Next, at the step S430, the duty control signal CTR_DT is generated by incorporating the first tracking type, that is, the SAR tracking type, into a bit of the first bits assigned at the step S420, and then the duty ratio of the input clock signal CTR_IN is adjusted in response to the duty control signal CTR_DT. At the step S440, whether the SAR tracking type is incorporated into all of the first bits is determined. If, as a result of the determination, the SAR tracking type is determined not to be incorporated into all of the first bits, the process returns to the step S430. If, as a result of the determination, the SAR tracking type is determined to be incorporated into all of the first bits, the process proceeds to the step S450.

Next, at the step S450, the duty control signal CTR_DT is generated by incorporating the second tracking type, that is, the linear tracking type, into a bit of the second bits assigned at the step S420, and then the duty ratio of the input clock signal CLK_IN is adjusted in response to the duty control signal CTR_DT. At the step S460, whether the linear tracking type is incorporated into all of the second bits is determined. If, as a result of the determination, the linear tracking type is determined not to be incorporated into all of the second bits, the process returns to the step S450. If, as a result of the determination, the linear tracking type is determined to be incorporated into all of the second bits, the process ends.

The operation method of duty cycle correction circuit in accordance with the embodiment of the present invention may generate the duty control signal CTR_DT and incorporate the SAR tracking type into some of a plurality of bits of the duty control signal CTR_DT and incorporate the linear tracking type into the remaining bits of the duty control signal CTR_DT as described above. Furthermore, the duty control signal CTR_DT generated as described above may respond to a small change of a clock signal sensitively. This means that an operation of correcting the duty ratio of the clock signal may be performed more precisely and faster.

Figure 5:
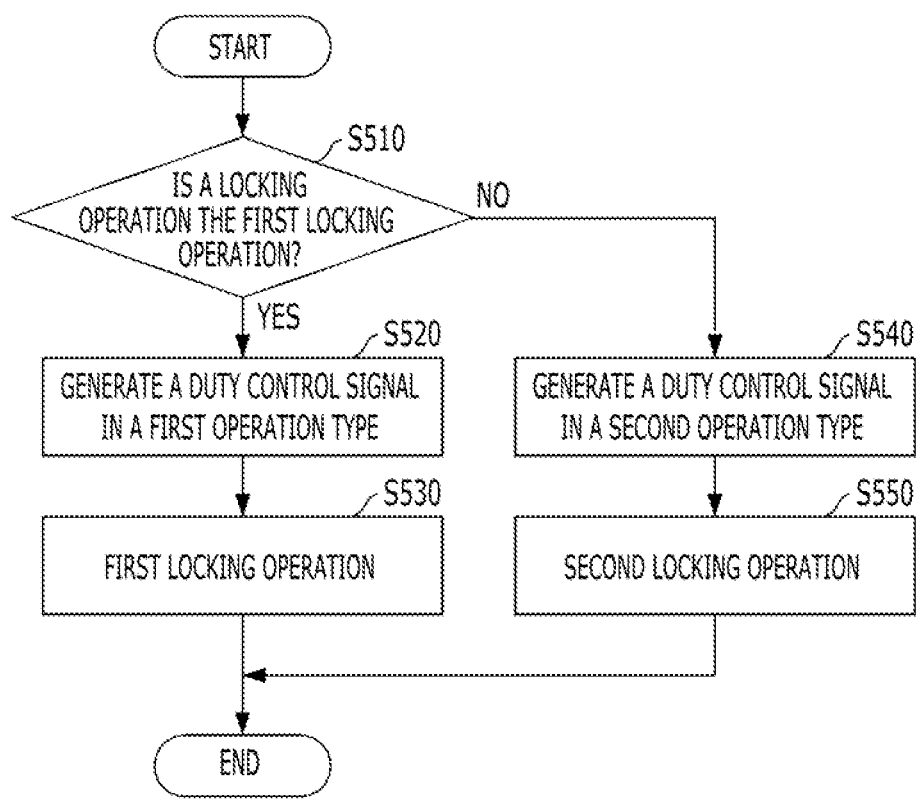
FIG. 5 is a flowchart illustrating operating method of the duty cycle correction circuit in accordance with yet another embodiment of the present invention.

FIG. 5 is a flowchart illustrating an operating method of the duty cycle correction circuit in accordance with yet another embodiment of the present invention. A relation between the duty control signal CTR_DT and first and second locking operations is described below. Here, the locking operation refers to an operation for a clock signal to be corrected at a target duty ratio.

Referring to FIG. 5, whether a locating operation is the first locking operation or not is determined at step S510, the duty control signal CTR_DT is generated in the first operation type at step S520, the first locking operation is performed at step S530, the duty control signal CTR_DT is generated in the second operation type at step S540, and the second locking operation is performed at step S550.

Referring to FIGS. 1 and 5, the step S510 is performed to select the first locking operation at the step S530 or the second locking operation at the step S550. If a locating operation is determined to be the first locking operation (i.e., Yes), the process proceeds to the step S520. If the locating operation is determined not to be the first locking operation (i.e., No), the process proceeds to the step S550.

If a locating operation is determined to be the first locking operation (i.e., Yes) at the step S510, the duty control signal CTR_DT is generated in the SAR operation type, that is, the first operation type, at the step S520. At the step S530, the duty ratio of the output clock signal CTR_CRR is corrected in response to the generated duty control signal CTR_DT, and the first locking operation is performed based on the corrected duty ratio. Here, the first locking operation refers to an operation of correcting the duty ratio of the output clock signal CTR_CRR at a predetermined target duty ratio (hereinafter referred to as a 'first target duty ratio'). Accordingly, at the step S530, the output clock signal CTR_CRR is corrected at the first target duty ratio.

Meanwhile, after the first locking operation, the duty ratio of the output clock signal CTR_CRR can be twisted again due to an external environment. That is, after the first locking operation, a duty ratio correction operation needs to be performed again, and this duty ratio correction operation is called a 'second locking operation' in one embodiment of the present invention. Here, the first locking operation and the second locking operation have different operation sections. The duty ratio of a clock signal may have been more slightly twisted in the second locking operation than in the first locking operation.

If, as a result of the determination at the step S510, the locking operation is determined not to be the first locking operation (i.e. No) the duty control signal CTR_DT is generated in the linear operation type, that is, the second operation type, at the step S540. At the step S550 the duty ratio of the output clock signal CTR_CRR is corrected in response to the generated duty control signal CTR_DT, and the second locking operation is performed based on the corrected duty ratio. Here, the second locking operation refers to an operation of correcting the duty ratio of the output clock signal CTR_CRR at a predetermined target duty ratio (hereinafter referred to as a 'second target duty ratio'). Accordingly, at the step S540, the output clock signal CTR_CRR is corrected at the second target duty ratio.

An operation of the duty cycle correction circuit in accordance with one embodiment of the present invention is divided into a first locking operation section in which a clock signal is corrected at the first target duty ratio and a second locking operation section in which a clock signal is corrected at the second target duty ratio. In other words, in the first locking operation section corresponding to the first locking operation, a duty correction operation can be performed in response to the duty control signal CTR_DT into which the SAR operation type has been incorporated, and in the second locking operation section corresponding to a subsequent locking operation, a duty correction operation can be performed in response to the duty control signal CTR_DT into which the linear operation type has been incorporated. Here, the first and the second target duty ratios can be set differently or identically according to circumstances. As a result, a different operation type is incorporated into the duty control signal CTR_DT depending on a locking operation section. Furthermore, the duty control signal CTR_DT generated as described above can respond to a small change of a clock signal more sensitively. This means that an operation of correcting the duty ratio of the clock signal can be performed more rapidly and precisely.

As described above, the duty cycle correction circuit in accordance with one embodiment of the present invention can generate the duty control signal CTR_DT in a different operation type depending on the duty ratio of a clock signal. Furthermore, an operation of correcting the duty ratio of a dock signal can be performed more rapidly and precisely using the duty control signal CTR_DT.

Furthermore, there is an advantage in that an environment in which a semiconductor device can use a clock signal having a target duty ratio can be provided more rapidly because the clock signal is generated more rapidly.

While the present invention has been described with respect to the specific embodiments, it will be apparent to those skilled in the art that various changes and modifications may be made without departing from the spirit and scope of the invention as defined in the following claims.

What is claimed is:

1. An operating method of a duty cycle correction circuit, the operating method comprising:
    detecting a duty ratio of an clock signal;
    assigning first and second bits into which first and second tracking types are incorporated among a plurality of bits forming a duty control signal based on the duty ratio of the clock signal;
    setting respective bits of the first bits; and
    setting respective bits of the second bits,
    wherein the duty ratio of the clock signal is adjusted in response to the duty control signal when a bit of the first or second bits is set,
    wherein the first tracking type comprises a successive approximation register (SAR) tracking type, and the second tracking type comprises a linear tracking type.

2. The operating method of claim 1, wherein the setting of the respective bits of the first bits comprises:
    setting a bit of the first bits;
    adjusting the duty ratio of the clock signal in response to the duty control signal; and
    determining whether the first tracking type is incorporated into all of the first bits.

3. The operating method of claim 2, further comprising setting another bit of the first bits when the first tracking type is determined to be not incorporated into all of the first bits.

4. The operating method of claim 1, wherein the setting of the respective bits of the second bits comprises:
    setting a bit of the second bits;
    adjusting the duty ratio of the clock signal in response to the duty control signal; and
    determining whether the second tracking type is incorporated into all of the second bits.

5. The operating method of claim 4, further comprising setting another bit of the second bits when the second tracking type is determined to be not incorporated into all of the first bits.

* * * * *